United States Patent
Baxter

(10) Patent No.: US 7,636,802 B1
(45) Date of Patent: Dec. 22, 2009

(54) DATA TRANSFER USING THE CONFIGURATION PORT OF A PROGRAMMABLE LOGIC DEVICE

(75) Inventor: Glenn A. Baxter, Los Gatos, CA (US)

(73) Assignee: XILINX, Inc., San Jose, CA (US)

( * ) Notice: Subject to any disclaimer, the term of this patent is extended or adjusted under 35 U.S.C. 154(b) by 449 days.

(21) Appl. No.: 11/786,662

(22) Filed: Apr. 11, 2007

(51) Int. Cl.
*G06F 13/00* (2006.01)

(52) U.S. Cl. .................... 710/33; 713/190; 713/193

(58) Field of Classification Search .............. 710/33; 713/190, 193
See application file for complete search history.

(56) References Cited

U.S. PATENT DOCUMENTS

| | | | |
|---|---|---|---|
| 6,255,848 B1 * | 7/2001 | Schultz et al. | 326/41 |
| 6,351,814 B1 * | 2/2002 | Batinic et al. | 713/194 |
| 6,381,732 B1 * | 4/2002 | Burnham et al. | 716/8 |
| 7,191,342 B1 * | 3/2007 | New et al. | 713/190 |
| 7,310,757 B2 * | 12/2007 | Ngo et al. | 714/725 |
| 7,493,511 B1 * | 2/2009 | Yin et al. | 713/600 |

* cited by examiner

*Primary Examiner*—Niketa Patel
*Assistant Examiner*—Ernest Unelus
(74) *Attorney, Agent, or Firm*—LeRoy D. Maunu; Thomas George

(57) ABSTRACT

Various embodiments of the invention provide a method for transferring communication data through one or more pins of a programmable logic device (PLD). The PLD includes a configuration port that may be used to program programmable logic and interconnect resources of the PLD. The programmable logic and interconnect resources include the input/output blocks of the PLD. Portions of the communication data are sequentially transferring between certain pins of the PLD and certain input/output registers in one or more input/output blocks associated with the pins. A frame of configuration data including a portion of the communication data is transferred between the input/output registers and a frame register of the configuration port of the PLD. Formats are converted between the portion of the communication data and the frame of the configuration data in the frame register of the PLD.

20 Claims, 6 Drawing Sheets

DATA TRANSFER USING THE CONFIGURATION PORT OF A PROGRAMMABLE LOGIC DEVICE

FIELD OF THE INVENTION

The present invention generally relates to input/output peripherals implemented in a programmable logic device.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points. The programmable logic implements the logic of a user design using programmable elements that can include, for example, function generators, registers, arithmetic logic, and so forth. In addition to the programmable tiles, some PLDs can include one or more dedicated processor blocks that can also be used to implement a user design.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Many user designs are implemented using a processor or processors. A processor of a user design can be a dedicated processor block included on the PLD or a soft processor that can be implemented in the programmable logic and interconnect resources of the PLD. Frequently, a user design includes various input/output peripherals that provide low bandwidth communication external to the PLD. A significant portion of the programmable logic and interconnect resources of the PLD can be required to implement a low bandwidth peripheral. The amount of unique logic of a user design that can be implemented on a PLD may be limited by the significant portion of the programmable logic and interconnect resources that are required to implement low bandwidth peripherals. In addition, the low bandwidth peripherals can operate at a relatively slow speed compared to the unique logic of the user design, and thus the high speed capabilities of the programmable logic and interconnection resources are underutilized by low bandwidth peripherals that are implemented in the programmable logic and interconnect resources of the PLD.

The present invention may address one or more of the above issues.

SUMMARY OF THE INVENTION

Various embodiments of the invention provide a method for transferring communication data through one or more pins of a programmable logic device (PLD). The PLD includes a configuration port that may be used to program programmable logic and interconnect resources of the PLD. The programmable logic and interconnect resources include the input/output blocks of the PLD. Portions of the communication data are sequentially transferring between certain pins of the PLD and certain input/output registers in one or more input/output blocks associated with the pins. A frame of configuration data including a portion of the communication data is transferred between the input/output registers and a frame register of the configuration port of the PLD. Formats are converted between the portion of the communication data and the frame of the configuration data in the frame register of the PLD.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
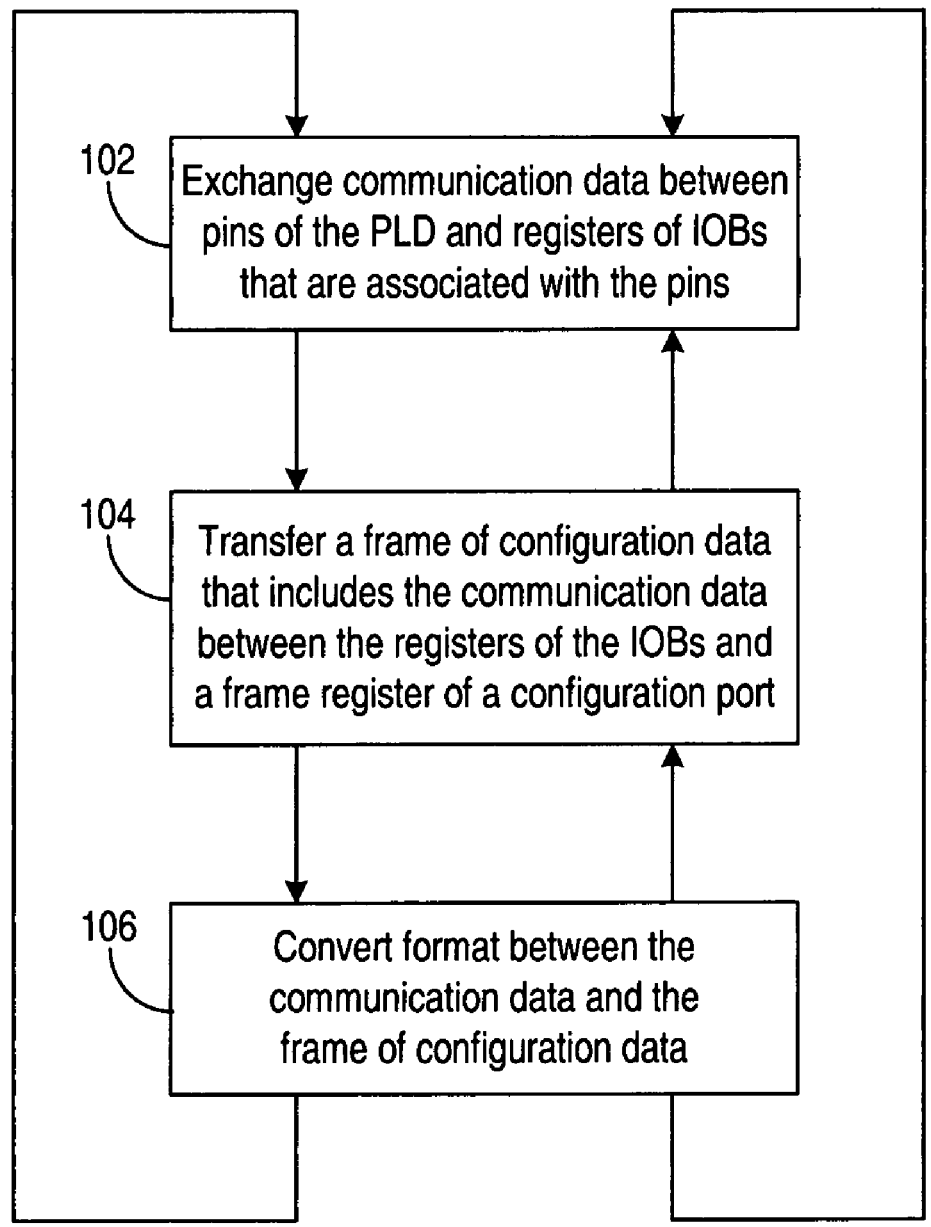
FIG. 1 is a flow diagram of a process for transferring communication data through one or more pins of a programmable logic device in accordance with various embodiments of the invention.

FIG. 1 is a flow diagram of a process for transferring communication data through one or more pins of a programmable logic device (PLD) in accordance with various embodiments of the invention. The communication data may be received or transmitted at the pin or pins of the PLD. Frequently, communication data may be received at certain pins and additional communication data may be transmitted at certain other pins. It will be appreciated that one or more pins may be bi-directional pins that both receive and transmit communication data using, for example, time-division multiplexing of the direction that communication data is transferred.

At step 102, the communication data is exchanged between pin(s) of the PLD and input/output register(s) that are associated with the pin(s), such as the input/output register(s) of an input/output block (IOB) or multiple IOBs for the pin(s).

At step 104, a respective frame of configuration data for each portion of the communication data is transferred between the input/output registers(s) and a frame register of a configuration port. For each portion of the communication data, the respective frame of configuration data includes the portion of the communication data. The configuration port of the PLD may be used to program the programmable logic and interconnect resources of the PLD, and the IOBs are included in these programmable logic and interconnect resources. Transferring the communication data within frames of configuration data may eliminate programmable logic and interconnect resources that would otherwise be needed for transferring the communication data, thereby reducing the programmable logic and interconnect resources that are required to implement certain user designs in a PLD.

At step 106, formats are converted between a format for each portion of the communication data and a format for the respective frame of configuration data from the frame register of the PLD. The conversion of formats may include extraction and/or merging of data.

In an embodiment that receives communication data at a pin of the PLD, portions of the communication data are sequentially received at the pin of the PLD and then sequentially transferred from the pin to input/output register(s) at step 102. For each portion of the communication data, a respective frame of configuration data that includes the portion of the communication data is transferred from the input/output register(s) to the frame register of the configuration port at step 104. At step 106, each portion of the communication data is extracted from the respective frame of the configuration data.

In an embodiment that transmits communication data at a pin of the PLD, each portion of the communication data is merged into a respective frame of configuration data at step 106. Each frame of configuration data is transferred from the frame register of the configuration port to input/output register(s) associated with the pin of the PLD at step 104. At step 102, the portions of the communication data are sequentially transferred from the input/output register(s) to the pin and sequentially transmitted from the PLD at the pin.

In an embodiment having bidirectional communication of received communication data and transmitted communication data at one or more pins of the PLD, the received communication data may be received from one or more pins and transferred to input/output registers at step 102, transferred within a frame of configuration data to a frame register of a configuration port at step 104, and extracted from the frame of configuration data at step 106. The transmitted communication data may also be merged into the frame of configuration data at step 106, transferred within the frame of configuration data from the frame register to input/output registers at step 104, and transferred for transmission at one or more pins at step 102.

Figure 2:
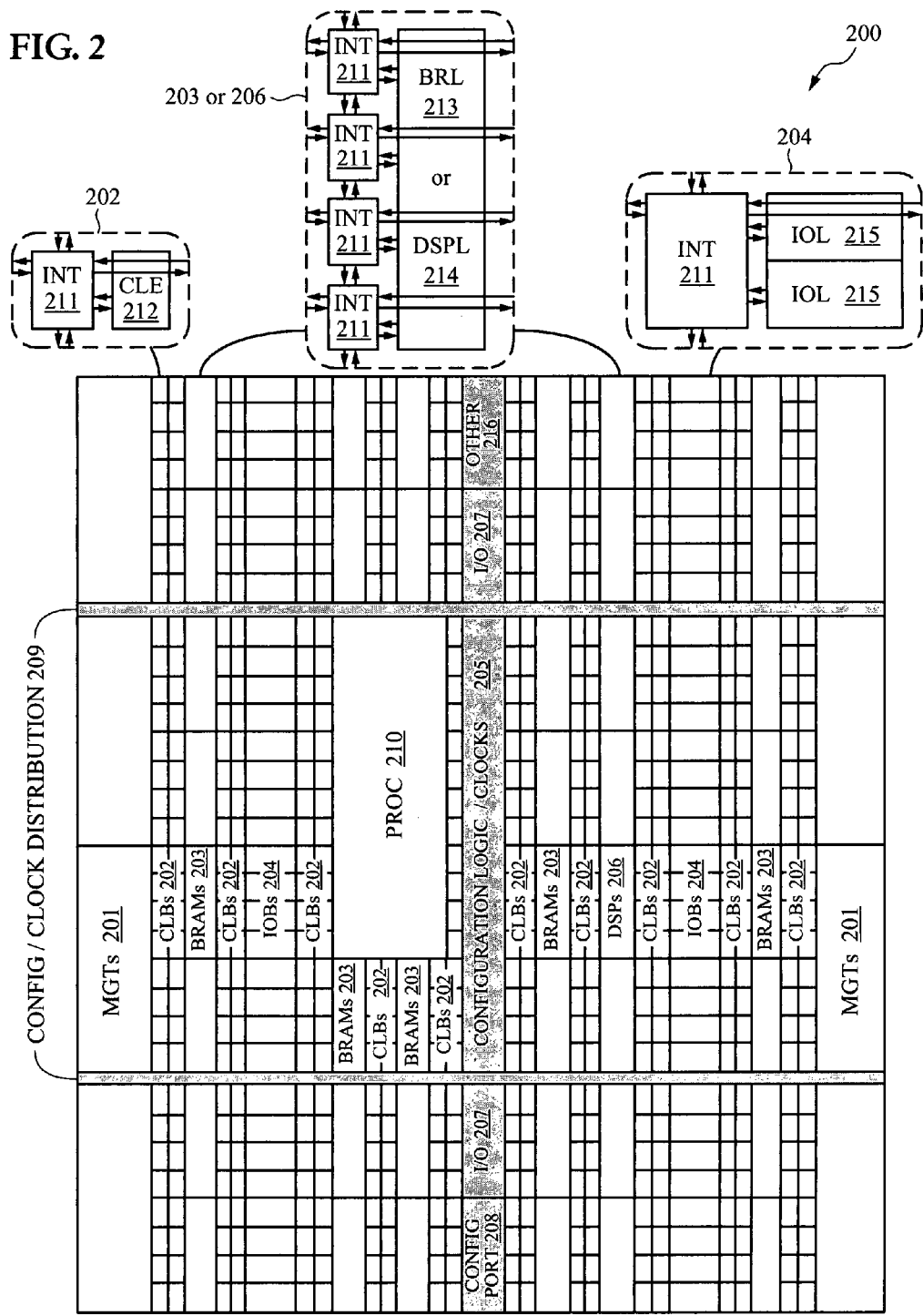
FIG. 2 is a block diagram of a programmable logic device that may be used for communicating data in accordance with various embodiments of the invention.

FIG. 2 is a block diagram of a programmable logic device that may be used for communicating data in accordance with various embodiments of the invention. The configuration port 208 may be used to program the FPGA 200 with configuration data from an external source, such as a non-volatile memory. The configuration port 208 may also be internally accessed by programmable logic and interconnect resources and/or processor 210 to configure or reconfigure some or all of the programmable logic and interconnect resources.

Advanced FPGAs can include array of tiles of several different types of programmable logic and interconnect resources. For example, FIG. 2 illustrates an FPGA 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 216 such as digital clock managers, analog-to-digital converters, system monitoring logic, and so forth. Some FPGAs also include dedicated processor blocks (PROC 210). It will be appreciated that soft processors, such as the MicroBlaze processor available from Xilinx, Inc., may be implemented in certain of the programmable logic and interconnect resources.

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one or more instances of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
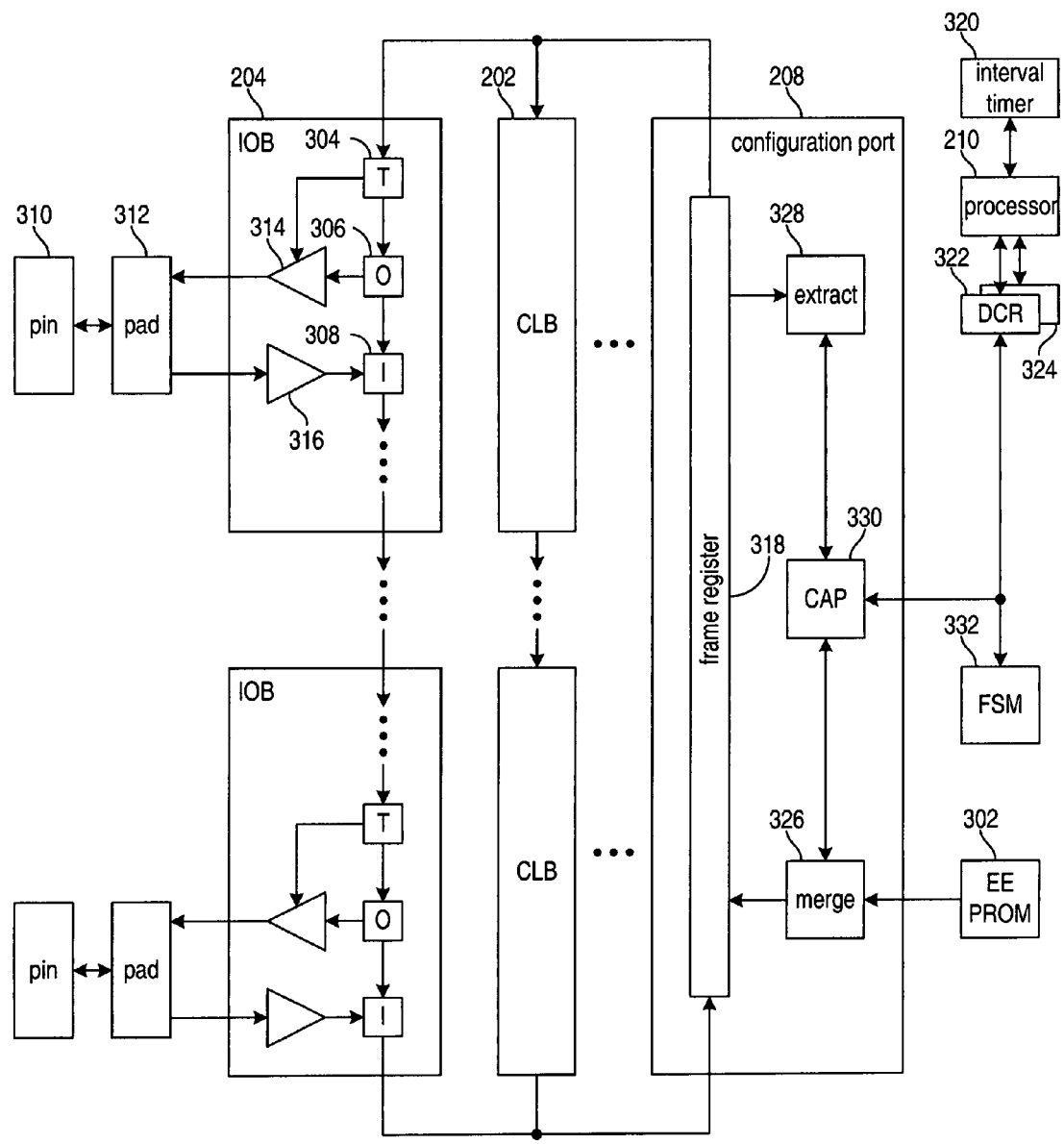
FIG. 3 is a block diagram illustrating the configuration port of a programmable logic device in accordance with various embodiments of the invention.

FIG. 3 is a block diagram illustrating the configuration port 208 of a programmable logic device in accordance with various embodiments of the invention. The configuration port 208 may be used to configure the programmable logic and interconnect resources, including IOB 204 and CLB 202, with configuration data from non-volatile storage, such as EEPROM 302. EEPROM 302 may be internal or external to the PLD. The configuration port 208 may also be internally accessible from the programmable logic and interconnect resources of the PLD and/or the processor 210 of the PLD via the Configuration Access Port (CAP) 330.

During configuration of the PLD, the input/output registers 304, 306, and 308 of IOB 204 may be configured to program the function of the IOB 204. For example, IOB 204 may be programmed to drive pin 310 of the PLD via pad 312 by configuring three-state enable register 304 with a value that enables driver 314, and the value driven by driver 314 may be set by the configuration of data output register 306. IOB 204 may be programmed to not drive pin 310 via pad 312 by configuring three-state enable register 304 with a value that disables driver 314. Regardless of whether driver 314 is enabled or disabled, the value received at receiver 316 from pin 310 via pad 312 may become available in input data register 308.

An IOB 204 may have more input/output registers than registers 304, 306, and 308 to provide additional programming options for IOB 204. For example, IOB 204 may be programmed to enable driver 314, disable driver 314, or dynamically control the enabling and disabling of driver 314 using a control signal from CLB 202 or another source. IOB 204 may also be programmed to transfer data between pin 310 and, for example, CLB 202. To clarify the discussion, the input/output registers of IOB 204 are shown as registers 304, 306, and 308; and it will be appreciated that for various input/output registers that provide additional programming options, various combinations of values for these input/output registers may provide certain programming options that are similar to the programming options provided by registers 304, 306, and 308. An IOB 204 may have further configuration programming options, such as control over the drive strength, input/output voltage thresholds, and enablement of special IOB 204 features including shift registers, double data rate registers, programmable delay elements, and other input/output related functions.

The configuration port 208 may be used to reconfigure part or all of a PLD that is already configured or partially configured. Processor 210 and/or finite state machine 332 may externally or internally control the reconfiguration of the PLD via configuration access port 330. The finite state machine 332 may be implemented in certain programmable logic and interconnect resources of the PLD. Reconfiguration may be used to redefine the function of the programmable logic and interconnect resources.

Various embodiments of the invention reuse the reconfiguration mechanism, including configuration port 208, to implement low-bandwidth communication protocols. The programmable logic and interconnect resources needed to implement the communication protocol may be reduced by using the reconfiguration mechanism instead of these resources to transport the communication data to the IOB 204 or multiple IOBs. For certain embodiments of the invention, the needed programmable logic and interconnect resources may be further reduced by implementing the communication protocol partially in software executing on processor 210. For a user design that includes one or more low-bandwidth communication ports, but does not use a processor 210 or does not use all of the processing power of a processor 210, the user design may be implemented in a PLD with the low-bandwidth communication protocol(s) partially implemented in software executing on processor 210 and transferring the communication data to the IOBs via configuration port 208.

In one embodiment of the invention, the low-bandwidth communication protocol or protocols are predominately implemented in software executing on processor 210. In another embodiment of the invention, the low-bandwidth communication protocol or protocols are predominately implemented in the hardware of finite state machine 332. In yet another embodiment of the invention, processor 210 cooperates with finite state machine 332 or other logic to implement the low-bandwidth communication protocol or protocols.

Because a low-bandwidth communication protocol implemented according to existing methods in programmable logic and interconnect resources generally has a low operating speed, a low-bandwidth communication protocol may be more readily implemented in software executing on processor 210 than other high-speed functions of the user design that are implemented in the programmable resources. Thus, efficiency of utilization of the programmable logic and interconnect resources may be improved by implementing a low-bandwidth communication protocol in software and using the configuration port 208 to transfer the communication data to the IOB 204 or IOBs. In addition, the availability of communication protocols implemented in either programmable resources or in software executing on processor 210 may provide flexibility that permits a user design to be implemented in a particular PLD when either the availability of processor power or the availability of programmable logic and interconnect resources is limited.

An example low-bandwidth communication protocol is the RS-232 serial communication protocol. For RS-232, each 8-bit character is framed with a start bit and one or more stop bits. To transmit an 8-bit character from the PLD at pin 310, the processor 210 may convert the 8-bit character into the sequence of bits of a framed 8-bit character, and sequentially transfer each bit to IOB 204 via configuration port 208. The start bit may be transferred by merging the start bit into frame register 318 and setting or clearing certain other bits of the frame register 318, such that after the reconfiguration mechanism is used to transfer the frame of configuration data in frame register 318 to at least IOB 204, three-state enable register 304 has a value that enables driver 314 and output register 306 has the value of the start bit. Pin 310 then starts driving the value of the start bit until another reconfiguration operation is performed to transmit a subsequent bit of the framed 8-bit character. The next reconfiguration operation may be performed after a delay that is determined by the baud rate of the RS-232 communication, and the end of the delay may be indicated by an interrupt from programmable interval timer 320. For each bit of the framed 8-bit character that has the same value as the prior bit, the software executing on processor 210 may skip the reconfiguration operation, allowing the driver 314 to continue driving this same value until a subsequent interrupt of the processor 210 by the programmable interval timer 320.

Frequently, the transfer of a frame of configuration data from frame register 318 to IOB 204 may cause the programming of other resources, such as CLB 202, to also be reconfigured. Because these other resources may be a part of the user design that should not be modified, the frame register 318 may be initialized by reading the current configuration and then merging a bit or other portion of the communication data into the frame register 318.

In one embodiment, the current configuration is read before each transfer of a frame of configuration data from the frame register 318 to the IOB 204. For example, alternating reads and writes of frames of configuration data may be used for bi-directional communication when a group of IOBs is accessible by a single frame of configuration data and certain of these IOBs are inputs and certain others are outputs. In another embodiment, the initial configuration is read once into frame register 318 and stored in processor 210 during the initialization of the software executing on processor 210, and this software subsequently merges each portion of the communication data into the stored copy of the initial configuration and then writes the merged result into the frame register 318 for transfer to the IOB 204. In yet another embodiment, a series of reads of configuration data may alternate with a series of writes of configuration data. For example, during bi-directional data communication through a single pin 310 of IOB 204, reads of frames of configuration data may be used to receive communication data at pin 310 and writes of frames of configuration data may be used to transmit communication data at pin 310.

In certain embodiments, the frame register 318 may be a 32-bit register that is accessible to processor 210 at the address of a device control register 322 of processor 210. Alternatively, the frame register 318 may similarly be accessible via a processor local bus, on-chip memory bus, or auxiliary processor unit of processor 210. The execution of a load instruction having the address within the device control register 322 address space to communicate via configuration access point 330 may read the 32-bit value of the frame register 318 into a register of processor 210, and the execution of a store instruction having the address of the device control register 322 may store the value of a register of processor 210 into the frame register 318. An additional data and control register 324 or registers may provide access to other parameters of the configuration port 208, such as an address that specifies the programmable logic and interconnect resources that are accessed during a reconfiguration operation.

In certain other embodiments, a merge function 326 and an extract function 328 assist the merging and extraction of each bit or other portion of the communication data in the frame of configuration data in frame register 318. For example, the merge function 326 may include a mask that specifies which bits of the frame register 318 are written during the execution of a store to device control register 322. The merge and extract functions 326 and 328 may be internal to configuration port 208 or may be, for example, implemented in the programmable logic and interconnect resources, via software executing on processor 210, or even a combination thereof.

Figure 4:
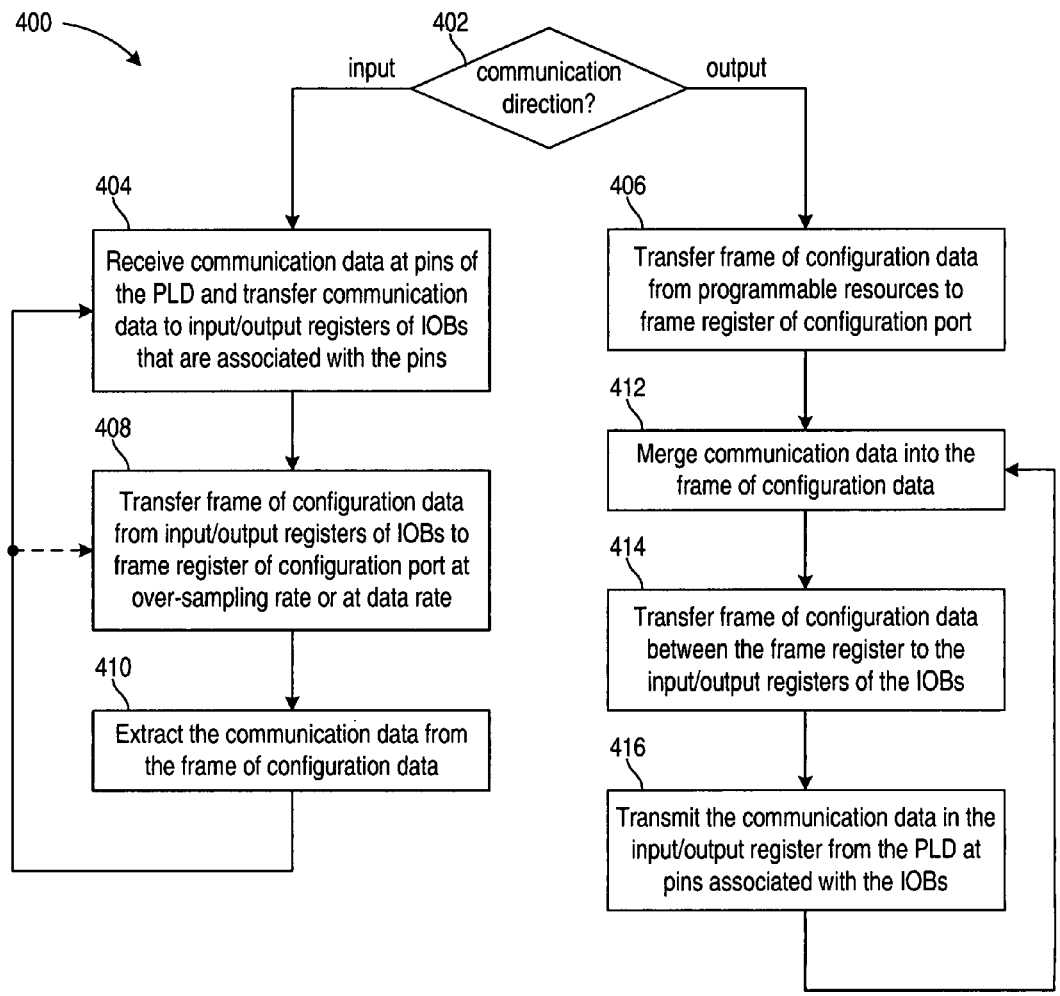
FIG. 4 is a flow diagram of an example process for transferring communication data between a frame register and at least one input/output block in accordance with various embodiments of the invention.

FIG. 4 is a flow diagram of an example process 400 for transferring communication data between a frame register and at least one input/output block in accordance with various embodiments of the invention. The transferring of communication data between a frame register of a configuration port and at least one IOB may be used to implement a low-bandwidth communication protocol in a PLD. Process 400 checks the direction of data communication at decision 402, and proceeds to step 404 for input to the PLD and proceeds to step 406 for output from the PLD.

At step 404, communication data is received at pins of the PLD and this communication data is transferred from the pins to input/output registers of IOBs that are associated with the pins. At step 408, a reconfiguration mechanism is used to transfer a frame of configuration data from the input/output registers and possibly other registers to a frame register of a configuration port. The transferring of configuration data at step 408 may occur at an over-sampling rate to establish synchronization, and in certain embodiments when already synchronized, the transferring of configuration at step 408 may occur at the data rate. At step 410, the communication data is extracted from the frame of configuration data. Depending upon whether or not over-sampling occurs before or after the next reception of communication data, process 400 may proceed from step 410 to either step 404 or step 408.

At step 406, a frame of configuration data may be transferred from programmable resources, which include the IOBs associated with the pins that transmit the communication data, to the frame register of the configuration port. This read of configuration data may initialize the frame register to prevent unintentional alteration of the configuration of other programmable logic and interconnect resources. At step 412, the communication data is merged into the frame of configuration data either in the frame register or in a register of a processor controlling the configuration port. At step 414, a reconfiguration mechanism is used to transfer the frame of configuration data from the frame register to the input/output registers of the IOBs and possibly other registers of other programmable resources. At step 416, the communication data in the input/output registers is transmitted from the PLD at the pins that are associated with the IOBs.

For bi-directional communication, steps 404, 408, and 410 may be used to receive data and also appropriately initialize the frame register, such that step 406 may be skipped when steps 412, 414, and 416 are subsequently used to transmit data.

Figure 5:
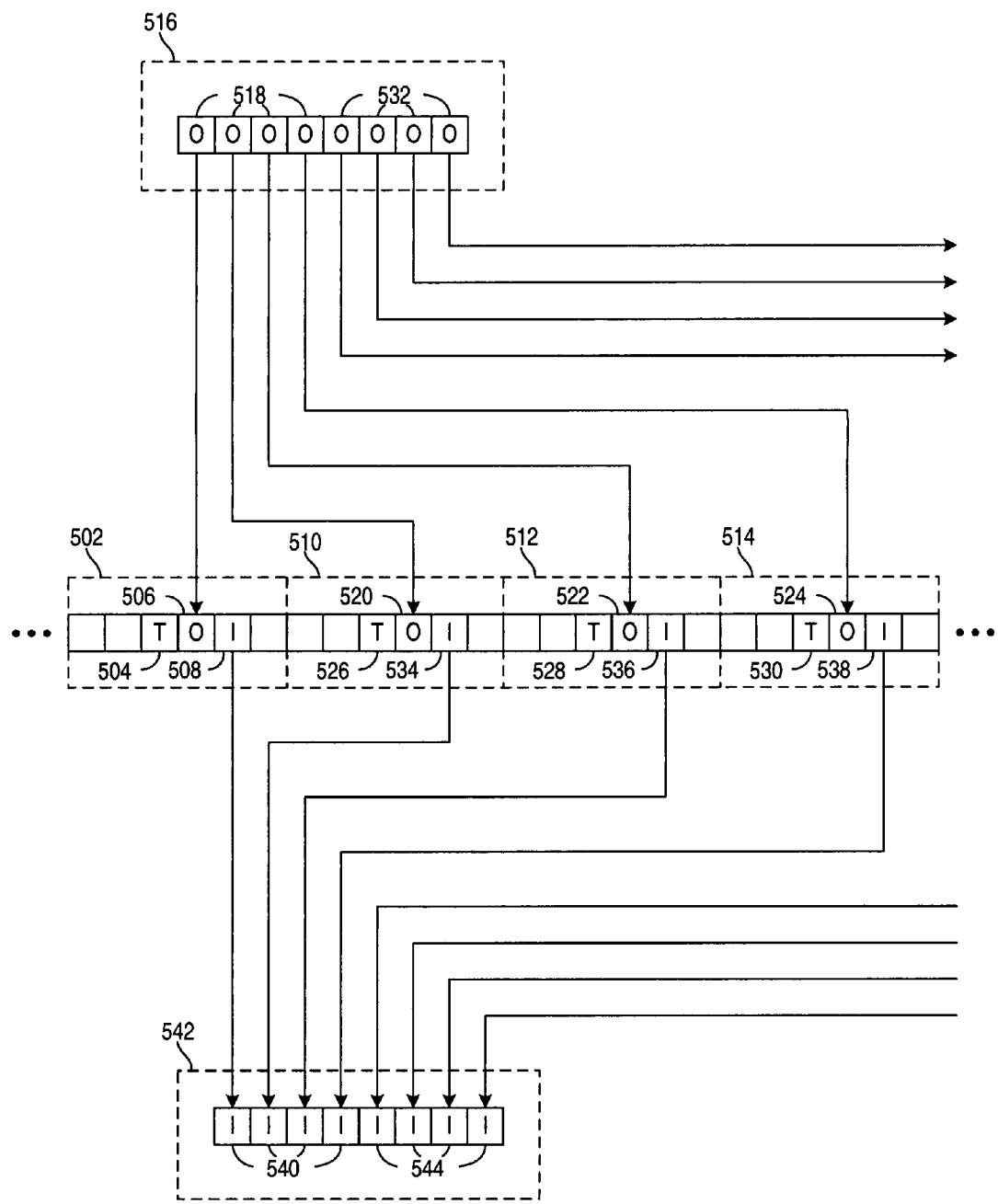
FIG. 5 is a data flow diagram illustrating extraction and merging of communication data in accordance with various embodiments of the invention.

FIG. 5 is a data flow diagram illustrating extraction and merging of communication data in accordance with various embodiments of the invention. Configuration data values 502 may correspond to the configuration data of the input/output registers of IOB 204 of FIG. 3, with three-state bit 504, output bit 506, and input bit 508, respectively corresponding to the values of the configuration data for three-state enable register 304, output register 306, and input register 308 of FIG. 3. Configuration data values 502, 510, 512, and 514 for respective IOBs may be part of a frame of configuration data. In one embodiment, each IOB may have 6 bits of configuration data and a frame of configuration data may have 32 bits including, for example, the configuration data values 502, 510, 512, 514, and 8 more bits of configuration data for other programmable logic and routing resources.

In one embodiment, a PLD implements an output port for a low-bandwidth communication protocol that outputs 8 bits in parallel at 8 pins of the output port, and the 8 bits of communication data 516 are transmitted in parallel from the PLD at these 8 pins of the output port. For an example PLD having 6 bits of configuration data per IOB and a 32 bit frame register, careful selection of the 8 pins for the output port may allow the configuration data for the corresponding IOBs to be accessed using two frames of configuration data. The available bandwidth for transferring frames of configuration data of the reconfiguration mechanism may be more efficiently utilized for low-bandwidth communication when the configuration data for multiple IOBs are accessible within a frame of configuration data. The transmission of the communication data 516 may include merging the 4 bits 518 into output bits 506, 520, 522, and 524, while setting the three-state enable bits 504, 526, 528, and 530 to enable the output drivers of the corresponding IOBs. The merged frame of configuration data may then be transferred to the IOBs using the reconfiguration mechanism to transmit half of the communication data 516 from the PLD. The other half of the communication data 516 of bits 532 may be similarly merged into another frame of configuration data and transferred for transmission using the reconfiguration mechanism.

In another embodiment, a PLD implements an input port for a low-bandwidth communication protocol that inputs 8 bits in parallel at 8 pins of the input port. The 8 bits of received data may be accessible by two frames of configuration data, with one of these frames including the three-state enable bits 504, 526, 528, and 530, and the input bits 508, 534, 536, and 538. An initialization step may write a frame of configuration data that sets values for the three-state enable bits 504, 526, 528, and 530 that disable the output drivers of the corresponding IOBs. Four of the 8 bits of parallel input may be accessible by using the reconfiguration mechanism to transfer the frame of configuration data into a frame register of a configuration port. The input bits 508, 534, 536, and 538 may be extracted from the frame register to produce the 4 bits 540 of the communication data 542. The other 4 bits 544 may be similarly extracted from another frame of configuration data.

The low-bandwidth communication protocols may be one or more of a serial communication port, an RS-232 serial communication port, an RS-485 serial communication port, a mouse port, a keyboard port, a serial peripheral interface (SPI) port, a controller area network (CAN) port, an inter-integrated circuit (I2C) port, a test access port (TAP), a parallel port, an Ethernet port such as a media independent interface (MII) port for 10 Mbit Ethernet, and a general purpose input/output port. In one embodiment, the reconfiguration mechanism includes a serial shift chain between the frame register and the programmable logic and routing resources, and the serial shift chain operates at a frequency of up to 50 MHz, providing up to 50 megabits per second of low-bandwidth communications. The available serial shift chain bandwidth may be divided between multiple implementations of low-bandwidth communication ports implemented by the PLD. It will be appreciated that achievable bandwidth may be reduced because the reception of communication data may require over-sampling for purposes such as synchronization and the available bandwidth of the serial shift chain may need to be divided between the input bandwidth and the output bandwidth of each low-bandwidth communication protocol. It will also be appreciated that improvements in the reconfiguration mechanism may increase the available bandwidth, allowing the implementation of additional communication protocols.

Figure 6:
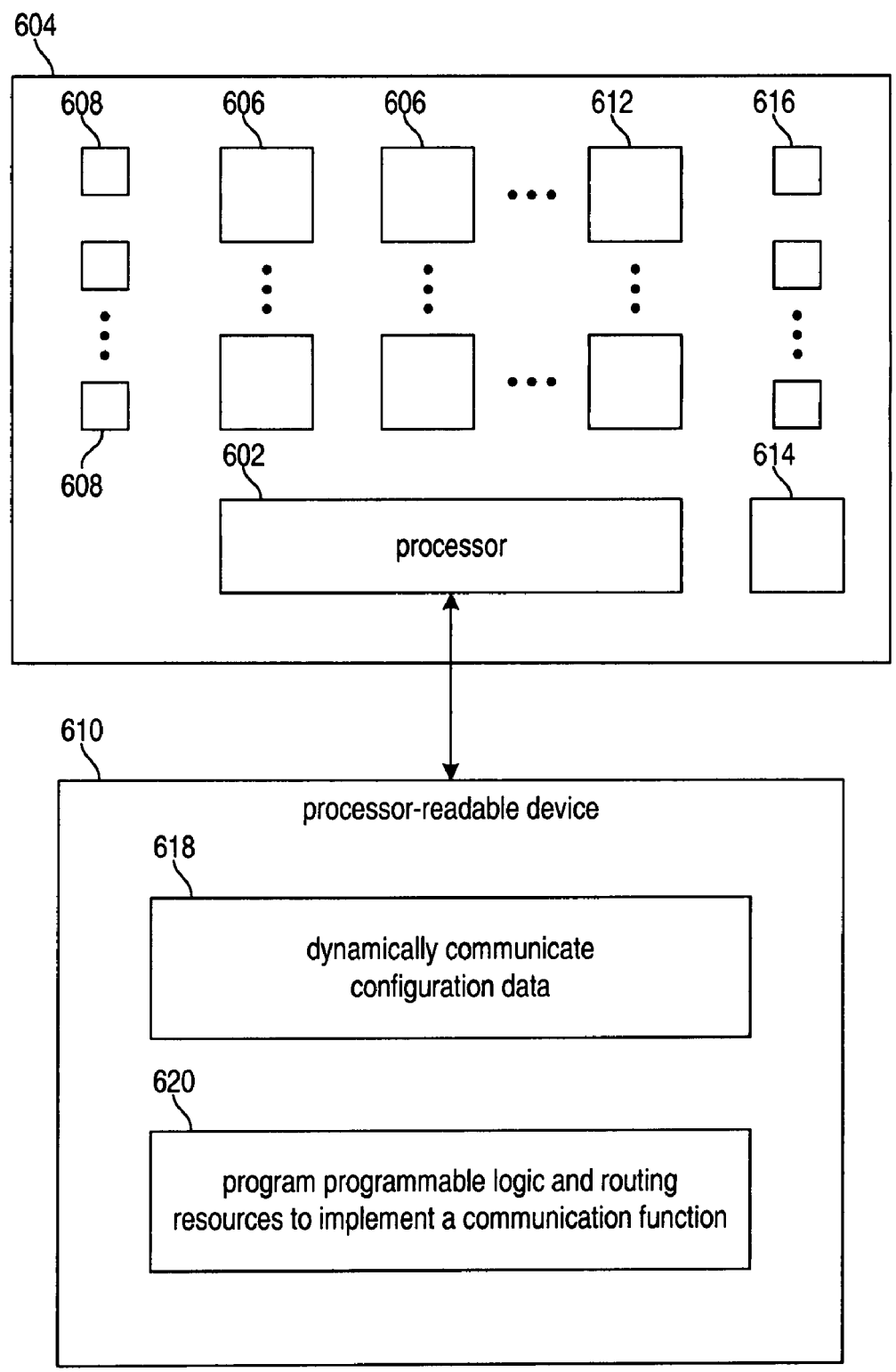
FIG. 6 is a block diagram of a system for transferring communication data in accordance with various embodiments of the invention.

FIG. 6 is a block diagram of an example system for transferring communication data in accordance with various embodiments of the invention. A processor 602 of a PLD 604 having programmable logic and interconnect resources 606 and 612 and pads 608 and 616 executes instructions of a program for transferring communication data.

A program storage medium includes a processor-readable device 610 configured with the instructions. Execution of instructions 618 by processor 602 causes processor 602 to dynamically communicate configuration data between the processor 602 and an input/output block 612 via a configuration port 614 that may be used to program programmable logic and interconnect resources 606 and 612 of the PLD 604. Communication data, which is included in the configuration data, is transferred to or from the PLD 604 through the input/output pad 616 that is coupled to input/output block 612.

In one embodiment, multiple frames of the configuration data are communicated, with each frame of the configuration data including a respective portion of the communication data. In another embodiment, the execution of instructions 620 causes processor 602 to program a portion of the programmable logic and interconnect resources 606 to implement a communication function, such as a merging or extraction function. The configuration data may be dynamically communicated between the processor 602 and the input/output block 612 of the PLD 604 through the configuration port 614 and the communication function. It will be appreciated that processor 602 may be either a dedicated processor block of the PLD 604 or a soft processor that is implemented in the programmable logic and interconnect resources of the PLD 604. In addition, an external processor may be substituted for processor 602.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems transferring communication data through at least one pin of a programmable logic device. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for transferring communication data through at least one pin of a programmable logic device (PLD), comprising:
sequentially transferring a plurality of portions of the communication data between the at least one pin of the PLD and at least one input/output register of an input/output block that is associated with the at least one pin;
for each portion of the communication data, transferring a respective frame of configuration data, which includes the portion of the communication data, between the at least one input/output register and a frame register of a configuration port used to program programmable logic and interconnect resources of the PLD including the input/output block; and
for each portion of the communication data, converting format between the portion of the communication data and the respective frame of the configuration data in the frame register of the PLD;
wherein the converting format between the portion of the communication data and the respective frame of the configuration data includes implementing a low-bandwidth communication protocol by merging or extracting the portion of the communication data into or out from the respective frame of the configuration data, and wherein a particular one of the at least one input/output register of the input/output block is a three-state register that enables or disables a driver.

2. The method of claim 1, wherein: the sequentially transferring the portions of the communication data includes sequentially receiving the portions of the communication data at the at least one pin of the PLD, and sequentially transferring the portions of the communication data from the at least one pin to the at least one input/output register, the transferring the respective frame of the configuration data includes transferring the respective frame of the configuration data from the at least one input/output register to the frame register, and the converting format between the portion of the communication data and the respective frame of the configuration data includes extracting the portion of the communication data from the respective frame of the configuration data.

3. The method of claim 2, wherein the transferring the respective frame of the configuration data from the at least one input/output register to the frame register occurs at an over-sampling rate.

4. The method of claim 1, wherein: the converting format between the portion of the communication data and the respective frame of the configuration data includes merging the portion of the communication data into the respective frame of the configuration data, the transferring the respective frame of the configuration data includes transferring the respective frame of the configuration data from the frame register to the at least one input/output register, and the sequentially transferring the portions of the communication data includes sequentially transferring the portions of the communication data from the at least one input/output register to the at least one pin, and sequentially transmitting the portions of the communication data from the PLD at the at least one pin.

5. The method of claim 4, wherein the merging the portion of the communication data into the respective frame of the configuration data includes transferring a respective initial frame of the configuration data from the at least one input/output register to the frame register.

6. The method of claim 5, wherein the merging the portion of the communication data into the respective frame of the configuration data further includes merging the portion of the communication data into the frame register.

7. The method of claim 1, wherein a processor of the PLD controls the transferring the respective frame of the configuration data between the at least one input/output register and the frame register of the configuration port.

8. The method of claim 7, wherein the processor controls the transferring the respective frame of the configuration data between the at least one input/output register and the frame register in response to an interrupt from a programmable interval timer associated with the processor.

9. The method of claim 1, wherein a finite state machine implemented in the programmable logic and interconnect resources of the PLD controls the transferring the respective frame of the configuration data between the at least one input/output register and the frame register of the configuration port.

10. The method of claim 1, wherein a processor of the PLD performs the converting format between the portion of the communication data and the respective frame of the configuration data.

11. The method of claim 1, wherein the converting format for each portion of the communication data includes converting format between an 8-bit character of the communication data and at least the portion of the communication data.

12. The method of claim 11, wherein the converting format between the 8-bit character of the communication data and at least the portion of the communication data is implemented in the programmable logic and interconnect resources of the PLD.

13. The method of claim 1, wherein the low-bandwidth communication protocol is one of: a serial communication protocol, an RS-232 serial communication protocol, an RS-485 serial communication protocol, a mouse protocol, a keyboard protocol, a serial peripheral interface (SPI) protocol, a controller area network (CAN) protocol, an inter-integrated circuit (I2C) protocol, a test access port (TAP) protocol, a parallel protocol, or an Ethernet protocol.

14. A programmable logic device (PLD) configured to implement a user design that transfers communication data, comprising:
an array of programmable logic and interconnect resources including at least one input/output block associated with at least one pin of the PLD, wherein the at least one input/output block is configured to sequentially transfer the communication data between the at least one pin and at least one input/output register of the at least one input/output block;
a configuration port, including a frame register, configured to program the programmable logic and interconnect resources through the frame register with configuration data that implements the user design; and
a processor configured to execute software that performs operations for transferring the communication data through the at least one pin of the PLD, the operations including transferring a frame of configuration data, which includes the communication data, between the at least one input/output register and the frame register, and converting format between the communication data and the frame of the configuration data;
wherein the converting format between the communication data and the frame of the configuration data includes merging or extracting the communication data into or out from the frame of the configuration data, and wherein a particular one of the at least one input/output register of the at least one input/output block is a three-state register that enables or disables a driver.

15. The PLD of claim 14, wherein the processor is further configured to execute, in response to an interrupt from an interval timer associated with the processor, the software that performs the transferring the frame of configuration data and the converting format.

16. A processor-readable storage medium having processor-executable instructions that, when executed by one or more processors perform a method, comprising:
dynamically communicating configuration data between the one or more processors and an input/output block of the PLD through a configuration port of the PLD used to program programmable logic and interconnect resources of the PLD including the input/output block coupled to at least one input/output pad of the PLD, the dynamically communicating the configuration data includes transferring communication data included in the configuration data through the at least one input/output pad;
wherein the dynamically communicating the configuration data further includes merging or extracting the communication data into or out from a plurality of frames of the configuration data, and wherein a particular one of at least one input/output register of the input/output block is a three-state register that enables or disables a driver.

17. The processor-readable storage medium of claim 16, wherein the dynamically communicating the configuration data includes communicating of the plurality of frames of the configuration data, the frames of the configuration data including respective portions of the communication data.

18. The processor-readable storage medium of claim 16, wherein the operations performed by the one or more processors further include programming a portion of the programmable logic and interconnect resources of the PLD to implement a communication function, the dynamically communicating the configuration data including dynamically communicating the configuration data between the one or more processors and the input/output block of the PLD through the configuration port and the communication function.

19. The PLD of claim 14, wherein the low-bandwidth communication protocol is one of: a serial communication protocol, an RS-232 serial communication protocol, an RS-485 serial communication protocol, a mouse protocol, a keyboard protocol, a serial peripheral interface (SPI) protocol, a controller area network (CAN) protocol, an inter-integrated circuit (I2C) protocol, a test access port (TAP) protocol, a parallel communication protocol, or an Ethernet protocol.

20. The processor-readable medium of claim 16, wherein the low-bandwidth communication protocol is one of: a serial communication protocol, an RS-232 serial communication protocol, an RS-485 serial communication protocol, a mouse protocol, a keyboard protocol, a serial peripheral interface (SPI) protocol, a controller area network (CAN) protocol, an inter-integrated circuit (I2C) protocol, a test access port (TAP) protocol, a parallel communication protocol, or an Ethernet protocol.

* * * * *